US011901873B2

(12) United States Patent
Yantchev (10) Patent No.: US 11,901,873 B2
(45) Date of Patent: Feb. 13, 2024

(54) TRANSVERSELY-EXCITED FILM BULK ACOUSTIC RESONATOR WITH PARTIAL BRAGG REFLECTORS

(71) Applicant: Murata Manufacturing Co., Ltd., Nagaokakyo (JP)

(72) Inventor: Ventsislav Yantchev, Sofia (BG)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 556 days.

(21) Appl. No.: 16/819,591

(22) Filed: Mar. 16, 2020

(65) Prior Publication Data
US 2020/0295729 A1    Sep. 17, 2020

Related U.S. Application Data

(60) Provisional application No. 62/818,568, filed on Mar. 14, 2019.

(51) Int. Cl.
*H03H 9/02*      (2006.01)
*H03H 9/17*      (2006.01)
(Continued)

(52) U.S. Cl.
CPC .... *H03H 9/02228* (2013.01); *H03H 9/02015* (2013.01); *H03H 9/02559* (2013.01);
(Continued)

(58) Field of Classification Search
CPC ............ H03H 9/02; H03H 9/175; H03H 9/25; H03H 9/64
See application file for complete search history.

(56) References Cited

U.S. PATENT DOCUMENTS 5,446,330 A    8/1995 Eda et al.
5,552,655 A    9/1996 Stokes et al.
(Continued)

FOREIGN PATENT DOCUMENTS

WO    2016017104        2/2016
WO    2018003273 A1    1/2018

OTHER PUBLICATIONS

T. Takai, H. Iwamoto, et al., "I.H.P.Saw Technology and its Application to Microacoustic Components (Invited). " 2017 IEEE International Ultrasonics Symposium, Sep. 6-9, 2017. pp. 1-8.
(Continued)

*Primary Examiner* — Andrea Lindgren Baltzell
*Assistant Examiner* — Alan Wong
(74) *Attorney, Agent, or Firm* — ARENTFOX SCHIFF LLP (57) ABSTRACT

Acoustic resonator devices and filters are disclosed. An acoustic resonator includes a substrate having a surface and a single-crystal piezoelectric plate having front and back surfaces, the back surface attached to the surface of the substrate except for a portion of the piezoelectric plate forming a diaphragm that spans a cavity in the substrate. An interdigital transducer (IDT) is formed on the front surface of the single-crystal piezoelectric plate such that interleaved fingers of the IDT are disposed on the diaphragm. The piezoelectric plate and the IDT are configured such that a radio frequency signal applied to the IDT excites a shear primary acoustic mode in the diaphragm. A back-side partial Bragg reflector is formed on the back surface of the diaphragm, and a front-side partial Bragg reflector is formed on the front surface of the diaphragm.

14 Claims, 7 Drawing Sheets

(51) Int. Cl.
 *H03H 9/205* (2006.01)
 *H03H 9/64* (2006.01)
(52) U.S. Cl.
 CPC ........ *H03H 9/02992* (2013.01); *H03H 9/175* (2013.01); *H03H 9/205* (2013.01); *H03H 9/6406* (2013.01)

(56) References Cited

U.S. PATENT DOCUMENTS

| | | | |
|---|---|---|---|
| 5,726,610 A | 3/1998 | Allen et al. | |
| 5,853,601 A | 12/1998 | Krishaswamy | |
| 6,377,140 B1 | 4/2002 | Ehara et al. | |
| 6,516,503 B1 | 2/2003 | Ikada et al. | |
| 6,540,827 B1 | 4/2003 | Levy et al. | |
| 6,707,229 B1 | 3/2004 | Martin | |
| 6,710,514 B2 | 3/2004 | Ikada et al. | |
| 7,345,400 B2 | 3/2008 | Nakao et al. | |
| 7,463,118 B2 | 12/2008 | Jacobsen | |
| 7,535,152 B2 | 5/2009 | Ogami et al. | |
| 7,684,109 B2 | 3/2010 | Godshalk et al. | |
| 7,728,483 B2 | 6/2010 | Tanaka | |
| 7,868,519 B2 | 1/2011 | Umeda | |
| 7,941,103 B2 | 5/2011 | Iwamoto et al. | |
| 7,965,015 B2 * | 6/2011 | Tai ..................... | H03H 9/02574 310/313 R |
| 8,278,802 B1 | 10/2012 | Lee et al. | |
| 8,294,330 B1 | 10/2012 | Abbott et al. | |
| 8,344,815 B2 | 1/2013 | Yamanaka | |
| 8,816,567 B2 | 8/2014 | Zuo et al. | |
| 8,829,766 B2 | 9/2014 | Milyutin et al. | |
| 8,932,686 B2 | 1/2015 | Hayakawa et al. | |
| 9,093,979 B2 | 7/2015 | Wang | |
| 9,130,145 B2 | 9/2015 | Martin et al. | |
| 9,219,466 B2 * | 12/2015 | Meltaus ................. | H03H 9/54 |
| 9,276,557 B1 | 3/2016 | Nordquist et al. | |
| 9,369,105 B1 | 6/2016 | Li | |
| 9,425,765 B2 | 8/2016 | Rinaldi | |
| 9,525,398 B1 | 12/2016 | Olsson | |
| 9,640,750 B2 | 5/2017 | Nakanishi et al. | |
| 9,748,923 B2 | 8/2017 | Kando et al. | |
| 9,762,202 B2 | 9/2017 | Thalmayr et al. | |
| 9,780,759 B2 | 10/2017 | Kimura et al. | |
| 9,837,984 B2 | 12/2017 | Khlat et al. | |
| 10,079,414 B2 | 9/2018 | Guyette et al. | |
| 10,187,039 B2 | 1/2019 | Komatsu et al. | |
| 10,200,013 B2 | 2/2019 | Bower et al. | |
| 10,211,806 B2 | 2/2019 | Bhattacharjee | |
| 10,284,176 B1 | 5/2019 | Solal | |
| 10,389,332 B2 * | 8/2019 | Bhattacharjee .... | H03H 9/02244 |
| 10,491,192 B1 | 11/2019 | Plesski et al. | |
| 10,601,392 B2 | 3/2020 | Plesski et al. | |
| 10,637,438 B2 | 4/2020 | Garcia et al. | |
| 10,644,674 B2 | 5/2020 | Takamine | |
| 10,756,697 B2 | 8/2020 | Plesski et al. | |
| 10,790,802 B2 | 9/2020 | Yantchev et al. | |
| 10,797,675 B2 | 10/2020 | Plesski | |
| 10,797,680 B2 * | 10/2020 | Mimura ................. | H03H 9/175 |
| 10,826,462 B2 | 11/2020 | Plesski et al. | |
| 10,868,512 B2 | 12/2020 | Garcia et al. | |
| 10,917,070 B2 | 2/2021 | Plesski et al. | |
| 2002/0079986 A1 | 6/2002 | Ruby et al. | |
| 2002/0158714 A1 | 10/2002 | Kaitila et al. | |
| 2002/0189062 A1 | 12/2002 | Lin et al. | |
| 2003/0080831 A1 | 5/2003 | Naumenko et al. | |
| 2003/0199105 A1 | 10/2003 | Kub et al. | |
| 2004/0100164 A1 | 5/2004 | Murata | |
| 2004/0261250 A1 | 12/2004 | Kadota et al. | |
| 2005/0185026 A1 | 8/2005 | Noguchi et al. | |
| 2005/0218488 A1 | 10/2005 | Matsuo | |
| 2005/0264136 A1 | 12/2005 | Tsutsumi et al. | |
| 2006/0179642 A1 | 8/2006 | Kawamura | |
| 2007/0182510 A1 | 8/2007 | Park | |
| 2007/0188047 A1 | 8/2007 | Tanaka | |
| 2007/0194863 A1 | 8/2007 | Shibata et al. | |
| 2007/0267942 A1 | 11/2007 | Matsumoto et al. | |
| 2008/0246559 A1 | 10/2008 | Ayazi | |
| 2010/0064492 A1 | 3/2010 | Tanaka | |
| 2010/0123367 A1 | 5/2010 | Tai et al. | |
| 2011/0018389 A1 | 1/2011 | Fukano et al. | |
| 2011/0018654 A1 | 1/2011 | Bradley et al. | |
| 2011/0109196 A1 | 5/2011 | Goto | |
| 2011/0278993 A1 | 11/2011 | Iwamoto | |
| 2012/0286900 A1 | 11/2012 | Kadota et al. | |
| 2013/0234805 A1 | 9/2013 | Takahashi | |
| 2013/0271238 A1 | 10/2013 | Onda | |
| 2013/0278609 A1 | 10/2013 | Stephanou et al. | |
| 2013/0321100 A1 | 12/2013 | Wang | |
| 2014/0130319 A1 | 5/2014 | Iwamoto | |
| 2014/0145556 A1 | 5/2014 | Kadota | |
| 2014/0151151 A1 | 6/2014 | Reinhardt | |
| 2014/0152145 A1 | 6/2014 | Kando et al. | |
| 2014/0173862 A1 | 6/2014 | Kando et al. | |
| 2014/0225684 A1 | 8/2014 | Kando et al. | |
| 2015/0042417 A1 | 2/2015 | Onodera et al. | |
| 2015/0319537 A1 | 11/2015 | Perois et al. | |
| 2015/0333730 A1 | 11/2015 | Meltaus | |
| 2016/0028367 A1 | 1/2016 | Shealy | |
| 2017/0063332 A1 | 3/2017 | Gilbert et al. | |
| 2017/0179928 A1 | 6/2017 | Raihn et al. | |
| 2017/0214381 A1 | 7/2017 | Bhattacharjee | |
| 2017/0214387 A1 | 7/2017 | Burak et al. | |
| 2017/0222617 A1 | 8/2017 | Mizoguchi | |
| 2017/0222622 A1 | 8/2017 | Solal et al. | |
| 2017/0370791 A1 | 12/2017 | Nakamura et al. | |
| 2018/0005950 A1 | 1/2018 | Watanabe | |
| 2018/0026603 A1 | 1/2018 | Iwamoto | |
| 2018/0033952 A1 | 2/2018 | Yamamoto | |
| 2018/0062615 A1 | 3/2018 | Kato et al. | |
| 2018/0062617 A1 | 3/2018 | Yun et al. | |
| 2018/0123016 A1 | 5/2018 | Gong | |
| 2018/0191322 A1 | 7/2018 | Chang et al. | |
| 2019/0068164 A1 | 2/2019 | Houlden et al. | |
| 2019/0123721 A1 | 4/2019 | Takamine | |
| 2019/0131953 A1 | 5/2019 | Gong | |
| 2019/0273480 A1 | 9/2019 | Lin | |
| 2019/0348966 A1 | 11/2019 | Campanella-Pineda | |
| 2020/0036357 A1 | 1/2020 | Mimura | |
| 2020/0235719 A1 | 7/2020 | Yantchev et al. | |

OTHER PUBLICATIONS

R. Olsson III, K. Hattar et al. "A high electromechanical coupling coefficient SH0 Lamb wave lithiumniobate micromechanical resonator and a method for fabrication" Sensors and Actuators A: Physical, vol. 209, Mar. 1, 2014, pp. 183-190.

M. Kadota, S. Tanaka, "Wideband acoustic wave resonators composed of hetero acoustic layer structure," Japanese Journal of Applied Physics, vol. 57, No. 7S1. Published Jun. 5, 2018. 5 pages.

Y. Yang, R. Lu et al. "Towards Ka Band Acoustics: Lithium Niobat Asymmetrical Mode Piezoelectric MEMS Resonators", Department of Electrical and Computer Engineering University of Illinois at Urbana-Champaign, May 2018. pp. 1-2.

Y. Yang, A. Gao et al. "5 Ghz Lithium Niobate Mems Resonators With High Fom of 153", 2017 IEEE 30th International Conference in Micro Electro Mechanical Systems (MEMS). Jan. 22-26, 2017. pp. 942-945.

USPTO/ISA, International Search Report and Written Opinion for PCT Application No. PCT/US2019/036433 dated Aug. 29, 2019.

USPTO/ISA, International Search Report and Written Opinion for PCT Application No. PCT/US2019/058632 dated Jan. 17, 2020.

G. Manohar, "Investigation of Various Surface Acoustic Wave Design Configurations for Improved Sensitivity." Doctoral dissertation, University of South Florida, USA, Jan. 2012, 7 pages.

Ekeom, D. & Dubus, Bertrand & Volatier, A.. (2006). Solidly mounted resonator (SMR) FEM-BEM simulation. 1474-1477. 10.1109/ULTSYM.2006.371.

Mizutaui, K. and Toda, K., "Analysis of lamb wave propagation characteristics in rotated Ycut Xpropagation LiNbO3 plates." Electron. Comm. Jpn. Pt. 1, 69, No. 4 (1986):47-55. doi:10.1002/ecja.4410690406.

(56) References Cited

OTHER PUBLICATIONS

Naumenko et al., "Optimal orientations of Lithium Niobate for resonator SAW filters", 2003 IEEE Ultrasonics Symposium—pp. 2110-2113. (Year: 2003).

Buchanan "Ceramit Materials for Electronics" 3rd Edition, first published in 2004 by Marcel Dekker, Inc. pp. 496 (Year 2004). Jan. 2004.

Sorokin et al. Study of Microwave Acoustic Attenuation in a Multi-frequency Bulk Acoustic Resonator Based on a Synthetic Diamond Single Crystal Published in Acoustical Physics, vol. 61, No. 6, 2015 pp. 675 (Year 2015) Jan. 2015.

Material Properties of Tibtech Innovations, © 2018 TIBTECH Innovations (Year 2018) Jan. 2018.

Zou, Jie "High-Performance Aluminum Nitride Lamb Wave Resonators for RF Front-End Technology" University of California, Berkeley, Summer 2015, pp. 63 (Year 2015) Jan. 2015.

Santosh, G., Surface acoustic wave devices on silicon using patterned and thin film ZnO, Ph.D. thesis, Feb. 2016, Indian Institute of technology Guwahati, Assam, India Feb. 2016.

Merriam Webster, dictionary meaning of the word "diaphragm", since 1828, Merriam Webster (Year: 1828) 1828.

Kadota et al. "5.4 Ghz Lamb Wave Resonator on LiNbO3 Thin Crystal Plate and Its Application," published in Japanese Journal of Applied Physics 50 (2011) 07HD11. (Year: 2011) 2011.

USPTO/ISA, International Search Report and Written Opinion for PCT Application No. PCT/US2020/45654 dated Oct. 29, 2020. 2020.

Safari et al. "Piezoelectric for Transducer Applications" published by Elsevier Science Ltd., pp. 4 (Year: 2000). 2020.

Moussa et al. Review on Triggered Liposomal Drug Delivery with a Focus on Ultrasound 2015, Bentham Science Publishers, pp. 16 (Year 2005) 2005.

Acoustic Properties of Solids ONDA Corporation 592 Weddell Drive, Sunnyvale, CA 94089, Apr. 11, 2003, pp. 5 (Year 2003). 2003.

Bahreynl, B. Fabrication and Design of Resonant Microdevices Andrew William, Inc. 2018, NY (Year 2008). 2008.

Namdeo et al. "Simulation on Effects of Electrical Loading due to Interdigital Transducers in Surface Acoustic Wave Resonator", published in Procedia Engineering 64 ( 2013) of Science Direct pp. 322-330 (Year: 2013) 2013.

Rodriguez-Madrid et al., "Super-High-Frequency SAW Resonators on AlN/Diamond", IEEE Electron Device Letters, vol. 33, No. 4, Apr. 2012, pp. 495-497. Year: 2012) 2012.

A. C. Guyette, "Theory and Design of Intrinsically Switched Multiplexers With Optimum Phase Linearity," in IEEE Transactions on Microwave Theory and Techniques, vol. 61, No. 9, pp. 3254-3264, Sep. 2013, doi: 10.1109/TMTT.2013.2274963. Sep. 2013.

Yanson Yang, Ruochen Lu, Songbin Gong, High Q Antisymmetric Mode Lithium Niobate MEMS Resonators With Spurious Mitigation, Journal of Microelectromechanical Systems, vol. 29, No. 2, Apr. 2020. Apr. 2, 2020.

Yu-Po Wong, Luyan Qiu, Naoto Matsuoka, Ken-ya Hashimoto, Broadband Piston Mode Operation for First-order Antisymmetric Mode Resonators, 2020 IEEE International Ultrasonics Symposium, Sep. 2020. Sep. 2020.

\* cited by examiner

TRANSVERSELY-EXCITED FILM BULK ACOUSTIC RESONATOR WITH PARTIAL BRAGG REFLECTORS

RELATED APPLICATION INFORMATION

This patent claims priority from provisional patent application 62/818,568, filed Mar. 14, 2019, entitled XBAR WITH PARTIAL BRAGG REFLECTOR. This patent is related to application Ser. No. 16/230,443, filed Dec. 21, 2018, entitled TRANSVERSELY-EXCITED FILM BULK ACOUSTIC RESONATOR, now U.S. Pat. No. 10,491,192.

NOTICE OF COPYRIGHTS AND TRADE DRESS

A portion of the disclosure of this patent document contains material which is subject to copyright protection. This patent document may show and/or describe matter which is or may become trade dress of the owner. The copyright and trade dress owner has no objection to the facsimile reproduction by anyone of the patent disclosure as it appears in the Patent and Trademark Office patent files or records, but otherwise reserves all copyright and trade dress rights whatsoever.

BACKGROUND

Field

This disclosure relates to radio frequency filters using acoustic wave resonators, and specifically to filters for use in communications equipment.

Description of the Related Art

A radio frequency (RF) filter is a two-port device configured to pass some frequencies and to stop other frequencies, where "pass" means transmit with relatively low signal loss and "stop" means block or substantially attenuate. The range of frequencies passed by a filter is referred to as the "pass-band" of the filter. The range of frequencies stopped by such a filter is referred to as the "stop-band" of the filter. A typical RF filter has at least one pass-band and at least one stop-band. Specific requirements on a pass-band or stop-band depend on the specific application. For example, a "pass-band" may be defined as a frequency range where the insertion loss of a filter is better than a defined value such as 1 dB, 2 dB, or 3 dB. A "stop-band" may be defined as a frequency range where the rejection of a filter is greater than a defined value such as 20 dB, 30 dB, 40 dB, or greater depending on application.

RF filters are used in communications systems where information is transmitted over wireless links. For example, RF filters may be found in the RF front-ends of cellular base stations, mobile telephone and computing devices, satellite transceivers and ground stations, IoT (Internet of Things) devices, laptop computers and tablets, fixed point radio links, and other communications systems. RF filters are also used in radar and electronic and information warfare systems.

RF filters typically require many design trade-offs to achieve, for each specific application, the best compromise between performance parameters such as insertion loss, rejection, isolation, power handling, linearity, size and cost. Specific design and manufacturing methods and enhancements can benefit simultaneously one or several of these requirements.

Performance enhancements to the RF filters in a wireless system can have broad impact to system performance. Improvements in RF filters can be leveraged to provide system performance improvements such as larger cell size, longer battery life, higher data rates, greater network capacity, lower cost, enhanced security, higher reliability, etc. These improvements can be realized at many levels of the wireless system both separately and in combination, for example at the RF module, RF transceiver, mobile or fixed sub-system, or network levels.

The desire for wider communication channel bandwidths will inevitably lead to the use of higher frequency communications bands. The current LTE' (Long Term Evolution) specification defines frequency bands from 3.3 GHz to 5.9 GHz. Some of these bands are not presently used. Future proposals for wireless communications include millimeter wave communication bands with frequencies up to 28 GHz.

High performance RF filters for present communication systems commonly incorporate acoustic wave resonators including surface acoustic wave (SAW) resonators, bulk acoustic wave (BAW) resonators, film bulk acoustic wave resonators (FBAR), and other types of acoustic resonators. However, these existing technologies are not well-suited for use at the higher frequencies proposed for future communications networks.

Throughout this description, elements appearing in figures are assigned three-digit or four-digit reference designators, where the two least significant digits are specific to the element and the one or two most significant digit is the figure number where the element is first introduced. An element that is not described in conjunction with a figure may be presumed to have the same characteristics and function as a previously-described element having the same reference designator.

DETAILED DESCRIPTION

Description of Apparatus

Figure 1:
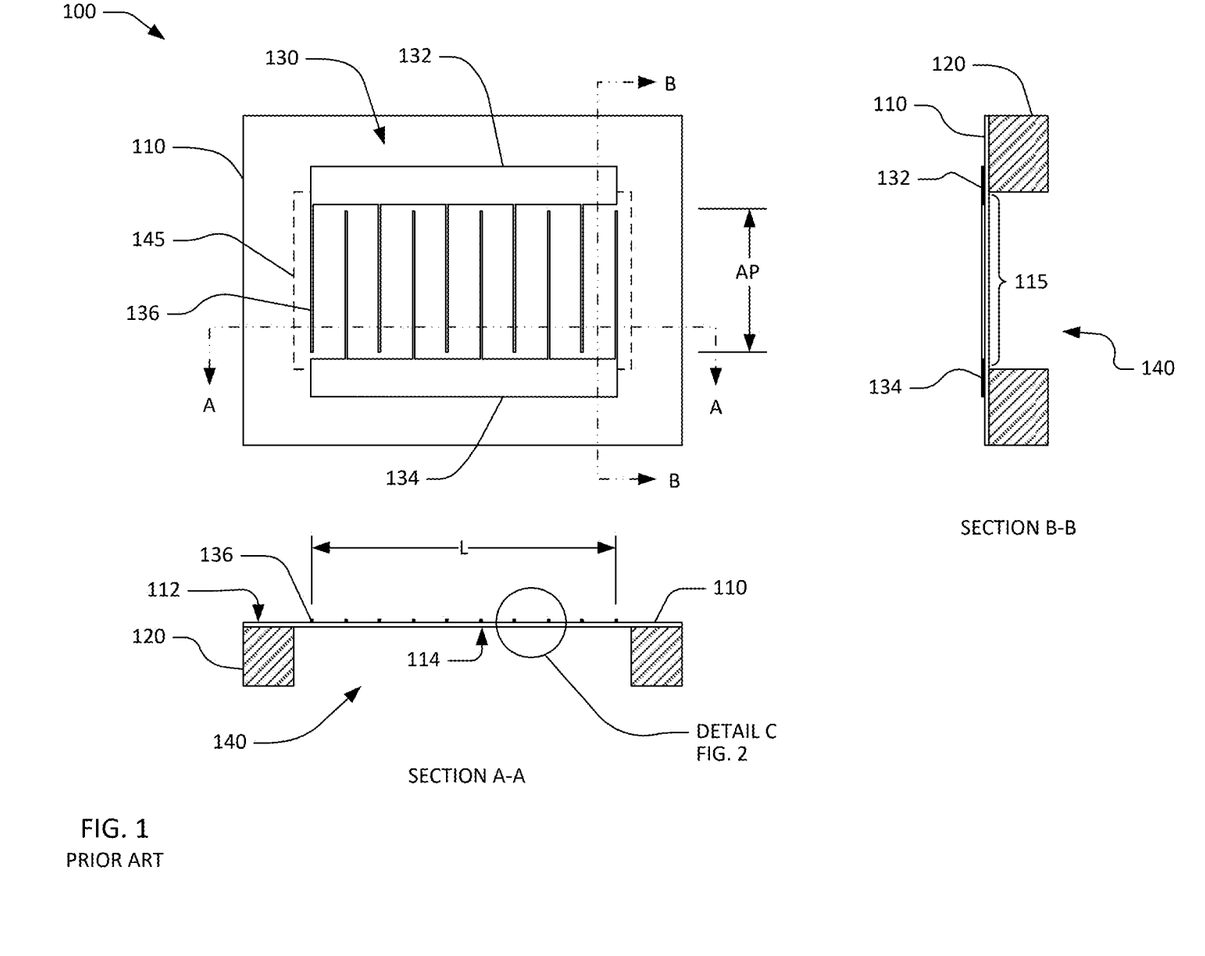
FIG. 1 includes a schematic plan view and two schematic cross-sectional views of a transversely-excited film bulk acoustic resonator (XBAR).

FIG. 1 shows a simplified schematic top view and orthogonal cross-sectional views of a transversely-excited film bulk acoustic resonator (XBAR) 100 as described in U.S. Pat. No. 10,491,192. XBAR resonators such as the resonator 100 may be used in a variety of RF filters including band-reject filters, band-pass filters, duplexers, and multiplexers. XBARs are particularly suited for use in filters for communications bands with frequencies above 3 GHz.

The XBAR 100 is made up of a thin film conductor pattern formed on a surface of a piezoelectric plate 110 having parallel front and back surfaces 112, 114, respectively. The piezoelectric plate is a thin single-crystal layer of a piezoelectric material such as lithium niobate, lithium tantalate, lanthanum gallium silicate, gallium nitride, or aluminum nitride. The piezoelectric plate is cut such that the orientation of the X, Y, and Z crystalline axes with respect to the front and back surfaces is known and consistent. In the examples presented in this patent, the piezoelectric plates are Z-cut, which is to say the Z axis is normal to the front and back surfaces 112, 114. However, XBARs may be fabricated on piezoelectric plates with other crystallographic orientations.

The back surface 114 of the piezoelectric plate 110 is attached to a surface of the substrate 120 except for a portion of the piezoelectric plate 110 that forms a diaphragm 115 spanning a cavity 140 formed in the substrate. The portion of the piezoelectric plate that spans the cavity is referred to herein as the "diaphragm" 115 due to its physical resemblance to the diaphragm of a microphone. As shown in FIG. 1, the diaphragm 115 is contiguous with the rest of the piezoelectric plate 110 around all of a perimeter 145 of the cavity 140. In this context, "contiguous" means "continuously connected without any intervening item".

The substrate 120 provides mechanical support to the piezoelectric plate 110. The substrate 120 may be, for example, silicon, sapphire, quartz, or some other material or combination of materials. The back surface 114 of the piezoelectric plate 110 may be bonded to the substrate 120 using a wafer bonding process. Alternatively, the piezoelectric plate 110 may be grown on the substrate 120 or attached to the substrate in some other manner. The piezoelectric plate 110 may be attached directly to the substrate or may be attached to the substrate 120 via one or more intermediate material layers.

"Cavity" has its conventional meaning of "an empty space within a solid body." The cavity 140 may be a hole completely through the substrate 120 (as shown in Section A-A and Section B-B) or a recess in the substrate 120 (as shown subsequently in FIG. 3A and FIG. 3B). The cavity 140 may be formed, for example, by selective etching of the substrate 120 before or after the piezoelectric plate 110 and the substrate 120 are attached.

The conductor pattern of the XBAR 100 includes an interdigital transducer (IDT) 130. The IDT 130 includes a first plurality of parallel fingers, such as finger 136, extending from a first busbar 132 and a second plurality of fingers extending from a second busbar 134. The first and second pluralities of parallel fingers are interleaved. The interleaved fingers overlap for a distance AP, commonly referred to as the "aperture" of the IDT. The center-to-center distance L between the outermost fingers of the IDT 130 is the "length" of the IDT.

The first and second busbars 132, 134 serve as the terminals of the XBAR 100. A radio frequency or microwave signal applied between the two busbars 132, 134 of the IDT 130 excites a primary acoustic mode within the piezoelectric plate 110. As will be discussed in further detail, the primary acoustic mode is a bulk shear mode where acoustic energy propagates along a direction substantially orthogonal to the surface of the piezoelectric plate 110, which is also normal, or transverse, to the direction of the electric field created by the IDT fingers. Thus, the XBAR is considered a transversely-excited film bulk wave resonator.

The IDT 130 is positioned on the piezoelectric plate 110 such that at least the fingers of the IDT 130 are disposed on the portion 115 of the piezoelectric plate that spans, or is suspended over, the cavity 140. As shown in FIG. 1, the cavity 140 has a rectangular shape with an extent greater than the aperture AP and length L of the IDT 130. A cavity of an XBAR may have a different shape, such as a regular or irregular polygon. The cavity of an XBAR may more or fewer than four sides, which may be straight or curved.

For ease of presentation in FIG. 1, the geometric pitch and width of the IDT fingers is greatly exaggerated with respect to the length (dimension L) and aperture (dimension AP) of the XBAR. A typical XBAR has more than ten parallel fingers in the IDT 110. An XBAR may have hundreds, possibly thousands, of parallel fingers in the IDT 110. Similarly, the thickness of the fingers in the cross-sectional views is greatly exaggerated.

Figure 2:
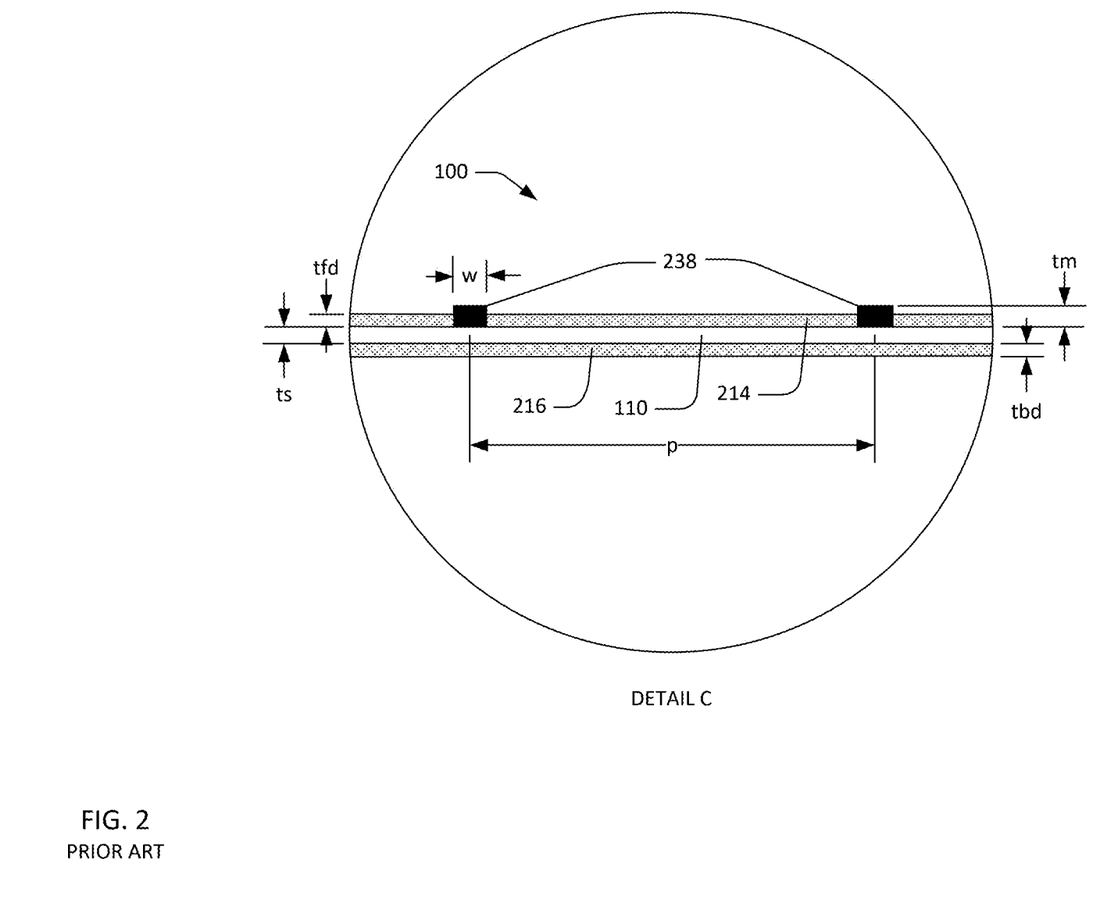
FIG. 2 is an expanded schematic cross-sectional view of a portion of the XBAR of FIG. 1.

FIG. 2 shows a detailed schematic cross-sectional view of the XBAR 100. The piezoelectric plate 110 is a single-crystal layer of piezoelectrical material having a thickness ts. ts may be, for example, 100 nm to 1500 nm. When used in filters for LTE™ bands from 3.4 GHZ to 6 GHz (e.g. bands 42, 43, 46), the thickness ts may be, for example, 200 nm to 1000 nm.

A front-side dielectric layer 214 may optionally be formed on the front side of the piezoelectric plate 110. The "front side" of the XBAR is, by definition, the surface facing away from the substrate. The front-side dielectric layer 214 has a thickness tfd. The front-side dielectric layer 214 is formed between the IDT fingers 238. Although not shown in FIG. 2, the front side dielectric layer 214 may also be deposited over the IDT fingers 238. A back-side dielectric layer 216 may optionally be formed on the back side of the piezoelectric plate 110. The back-side dielectric layer 216 has a thickness tbd. The front-side and back-side dielectric layers 214, 216 may be a non-piezoelectric dielectric material, such as silicon dioxide or silicon nitride. tfd and tbd may be, for example, 0 to 500 nm. tfd and tbd are typically less than the thickness ts of the piezoelectric plate. tfd and tbd are not necessarily equal, and the front-side and back-side dielectric layers 214, 216 are not necessarily the same material. Either or both of the front-side and back-side dielectric layers 214, 216 may be formed of multiple layers of two or more materials.

The IDT fingers 238 may be aluminum, a substantially aluminum alloy, copper, a substantially copper alloy, tungsten, molybdenum, beryllium, gold, or some other conductive material. Thin (relative to the total thickness of the conductors) layers of other metals, such as chromium or titanium, may be formed under and/or over the fingers to improve adhesion between the fingers and the piezoelectric plate 110 and/or to passivate or encapsulate the fingers. The busbars (132, 134 in FIG. 1) of the IDT may be made of the same or different materials as the fingers.

Dimension p is the center-to-center spacing or "pitch" of the IDT fingers, which may be referred to as the pitch of the IDT and/or the pitch of the XBAR. Dimension w is the width or "mark" of the IDT fingers. The IDT of an XBAR differs substantially from the IDTs used in surface acoustic wave (SAW) resonators. In a SAW resonator, the pitch of the IDT is one-half of the acoustic wavelength at the resonance frequency. Additionally, the mark-to-pitch ratio of a SAW resonator IDT is typically close to 0.5 (i.e. the mark or finger width is about one-fourth of the acoustic wavelength at resonance). In an XBAR, the pitch p of the IDT is typically 2 to 20 times the width w of the fingers. In addition, the pitch p of the IDT is typically 2 to 20 times the thickness is of the piezoelectric slab 212. The width of the IDT fingers in an XBAR is not constrained to one-fourth of the acoustic wavelength at resonance. For example, the width of XBAR IDT fingers may be 500 nm or greater, such that the IDT can be fabricated using optical lithography. The thickness tm of the IDT fingers may be from 100 nm to about equal to the width w. The thickness of the busbars (132, 134 in FIG. 1) of the IDT may be the same as, or greater than, the thickness tm of the IDT fingers.

An acoustic Bragg reflector is a stack of multiple layers that alternate between materials having high acoustic impedance and materials have low acoustic impedance. "High" and "low" are relative terms. For each layer, the standard for comparison is the adjacent layers. Each "high" acoustic impedance layer has an acoustic impedance higher than that of the adjacent low acoustic impedance layer or layers. Each "low" acoustic impedance layer has an acoustic impedance lower than that of the adjacent high acoustic impedance layer or layers. Each of the layers has a thickness equal to, or about, one-fourth of the acoustic wavelength in the respective material at predetermined frequency such that reflections from the interfaces between adjacent layers add in-phase. The predetermined frequency may be, for example, the resonance frequency or anti-resonance frequency of an acoustic resonator, or a frequency within a passband of a filter incorporating the acoustic resonator. Materials having comparatively low acoustic impedance include silicon dioxide, silicon oxycarbide, aluminum, and certain plastics such as cross-linked polyphenylene polymers. Materials having comparatively high acoustic impedance include silicon nitride, aluminum nitride, silicon carbide, and metals such as molybdenum, tungsten, gold, and platinum. Note that metal layers cannot be used in a Bragg reflector for an XBAR device. The presence of a metal layer distorts the electric field generated by the IDT and greatly reduces electromechanical coupling. All of the high acoustic impedance layers of an acoustic Bragg reflector are not necessarily the same material, and all of the low acoustic impedance layers are not necessarily the same material. Depending on the materials used, an acoustic Bragg reflector may have a few as five layers or as many as twenty layers.

Figure 3:
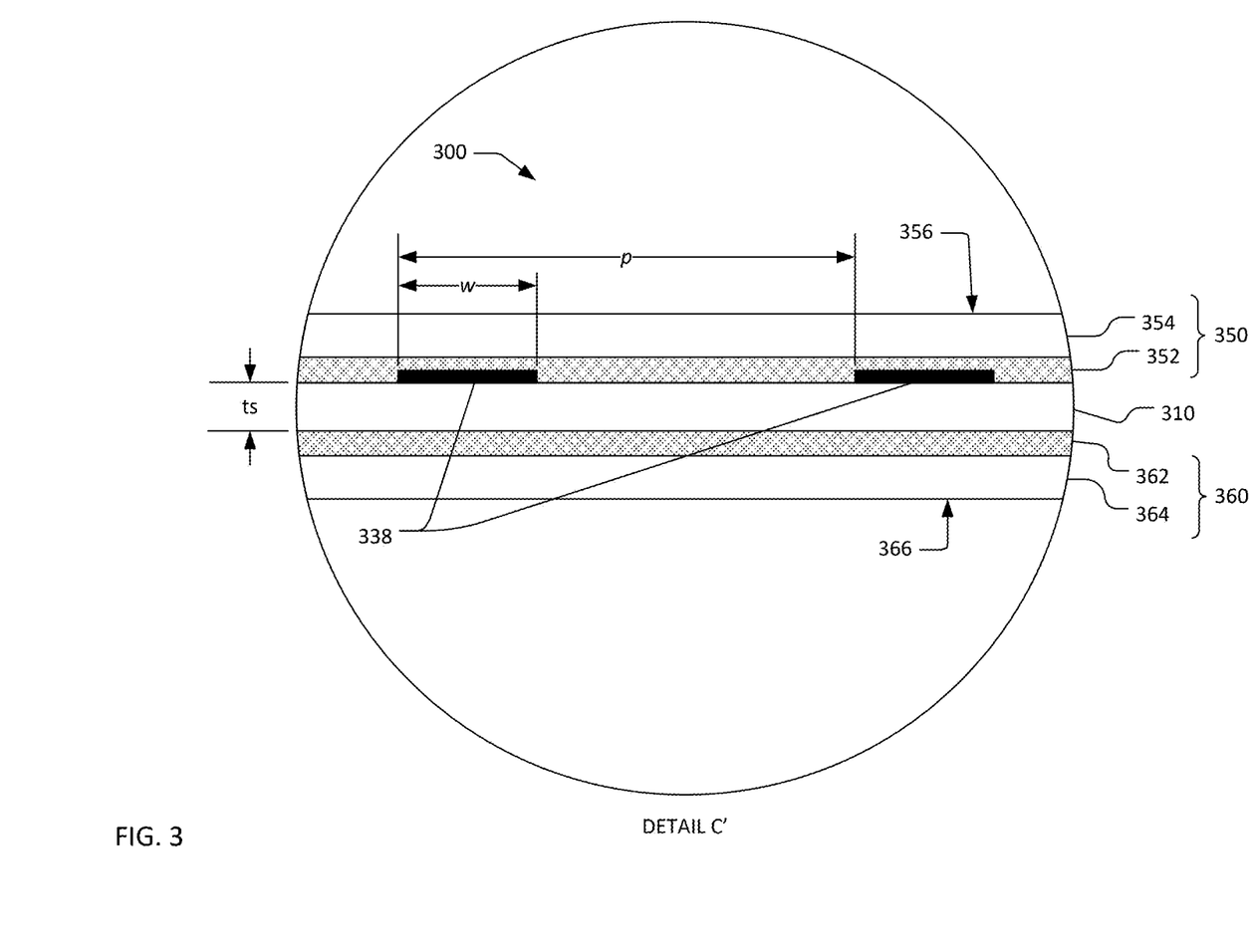
FIG. 3 is an expanded schematic cross-sectional view of a portion of an improved XBAR including partial Bragg reflectors.

FIG. 3 shows a detailed schematic cross-sectional view of an XBAR 300 that incorporates partial Bragg reflectors 350, 360 on both sides of a piezoelectric plate 310. On a larger scale, the XBAR 300 with partial Bragg reflectors is similar to the XBAR 100 of FIG. 1. The piezoelectric plate 310 is a thin single-crystal layer of a piezoelectric material such as lithium niobate, lithium tantalate, lanthanum gallium silicate, gallium nitride, or aluminum nitride. The piezoelectric plate 310 is cut such that the orientation of the X, Y, and Z crystalline axes with respect to the front and back surfaces is known and consistent. The thickness is of the piezoelectric plate 310 may be, for example, 100 nm to 1500 nm.

The IDT fingers 338 may be aluminum, a substantially aluminum alloy, copper, a substantially copper alloy, tungsten, molybdenum, beryllium, gold, or some other conductive material. Thin (relative to the total thickness of the conductors) layers of other metals, such as chromium or titanium, may be formed under and/or over the fingers to improve adhesion between the fingers 338 and the piezoelectric plate 310 and/or to passivate or encapsulate the fingers. The busbars (e.g. 132, 134 in FIG. 1) of the IDT may be made of the same or different materials as the fingers.

Dimension p is the center-to-center spacing or "pitch" of the IDT fingers, which may be referred to as the pitch of the IDT and/or the pitch of the XBAR. Dimension w is the width or "mark" of the IDT fingers.

A front-side partial Bragg reflector 350 is formed on the front side (i.e. the upper side as shown in FIG. 3) of the piezoelectric plate 310. The front-side partial Bragg reflector 350 includes a first layer 352 of low acoustic impedance dielectric material and a second layer 354 of high acoustic impedance dielectric material. Each of these layers 352, 354 has a thickness about one-quarter of the acoustic wavelength, in the respective material, of the primary acoustic mode at the predetermined frequency. The predetermined frequency may be, for example, the resonance or anti-resonance frequency of the XBAR 300 or a frequency within a passband of a filter incorporating the XBAR 300. This structure is considered a "partial Bragg reflector" because two layers are, of themselves, insufficient to reflect a large portion of the energy of an incident acoustic wave. Note that the primary acoustic mode of an XBAR is a shear wave that cannot propagate into air and is thus reflected at the output surface 356 of the second layer 354.

A back-side partial Bragg reflector 360 is formed on the back side (i.e. the lower side as shown in FIG. 3) of the piezoelectric plate 310. The back-side partial Bragg reflector 360 includes a first layer 362 of low acoustic impedance dielectric material and a second layer 364 of high acoustic impedance dielectric material. Each of these layers 362, 364 has a thickness about one-quarter of the acoustic wavelength, in the respective material, of the shear primary acoustic mode at the predetermined frequency.

A primary benefit of incorporating the partial Bragg reflectors 350, 360 into the XBAR 300 is the increased thickness of the diaphragm. Depending on the materials used in the partial Bragg reflectors 350, 360, the thickness of the diaphragm of the XBAR 300 will be three to five times the thickness of the diaphragm 115 of the XBAR 100 of FIG. 1. A thicker diaphragm is stiffer and less likely to bow or distort with changes in temperature. Further, the structure of the diaphragm of the XBAR 300 is symmetrical, which may also reduce the bow or distortion of the diaphragm.

The thicker diaphragm of the XBAR 300 will also have higher thermal conductivity, particularly if one or more layers in the partial Bragg reflectors is a high thermal conductivity dielectric material such as aluminum nitride. Higher thermal conductivity results in more efficient removal of heat from the diaphragm, which may allow the use of a smaller resonator area for a given heat load or power dissipation.

The XBAR 300 will also have higher capacitance per unit as compared with the XBAR 100 of FIG. 1 (for the same IDT pitch). Resonator capacitance is a circuit design issue. In particular, the requirement to match the input and output impedances of a filter to a defined value (commonly 50 ohms) dictates minimum capacitance values for some or all of the resonators in a filter. The higher capacitance per unit area of the XBAR 300 with partial Bragg reflectors allows the use of a smaller resonator area for any required capacitance.

Figure 4:
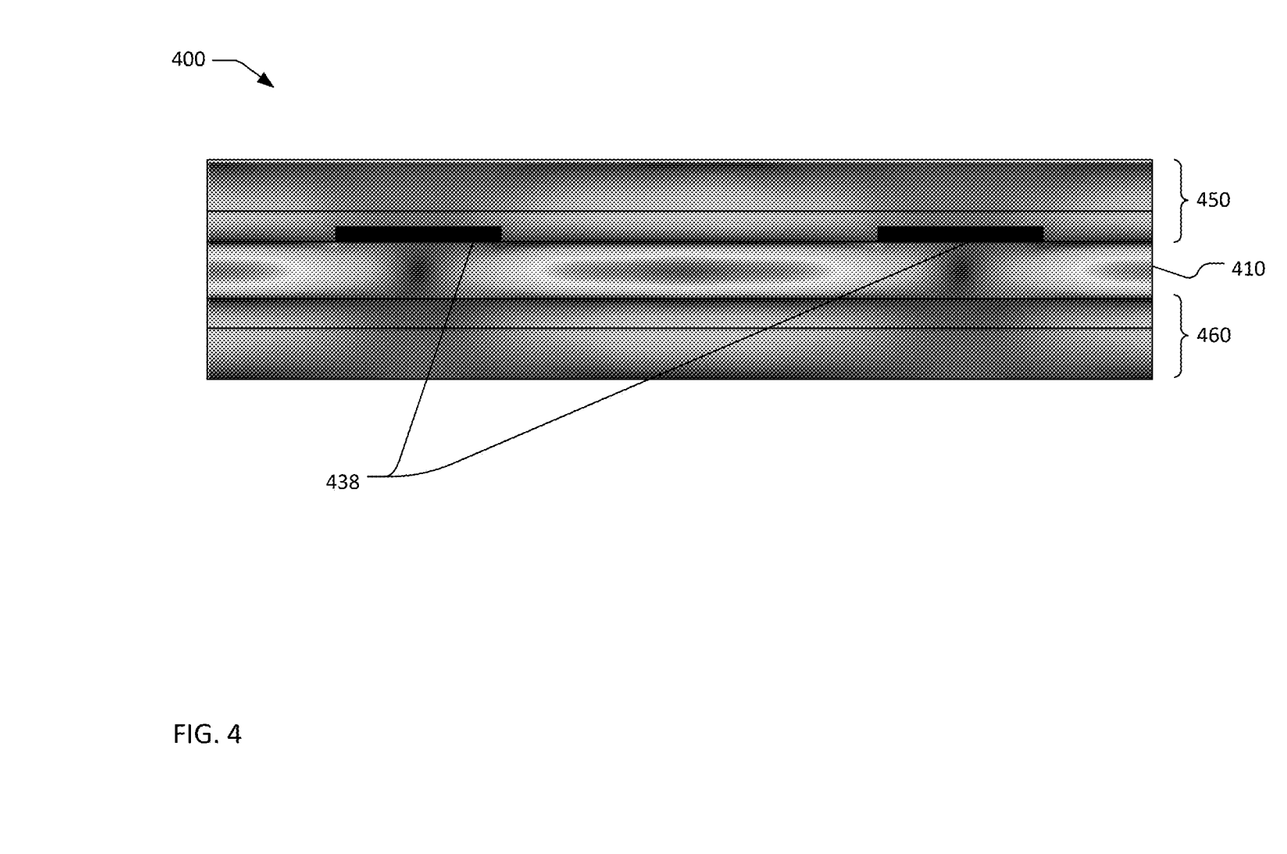
FIG. 4 is an expanded schematic cross-sectional view of a portion of the improved XBAR showing internal stress distribution at the resonance frequency of the XBAR.

FIG. 4. shows a schematic cross-sectional view of the stress in the diaphragm when the primary acoustic mode is excited at the resonance frequency of an XBAR 400. This detail view shows about the same portion of the XBAR 400 as was shown in FIG. 3, including the piezoelectric plate 410, the front-side partial Bragg reflector 450, the back-side partial Bragg reflector 460, and two IDT fingers 438. Various shades of gray represent different stress levels, with the highest stress at the center of the piezoelectric plate 410 and the lowest stress at the outer faces of the front-side and back-side partial Bragg reflectors 450, 460. The stress in the diaphragm is, like the structure of the diaphragm, substantially symmetrical about the center of the thickness of the diaphragm. This symmetry may reduce coupling for the primary acoustic mode to undesired higher-order acoustic modes.

Figure 5:
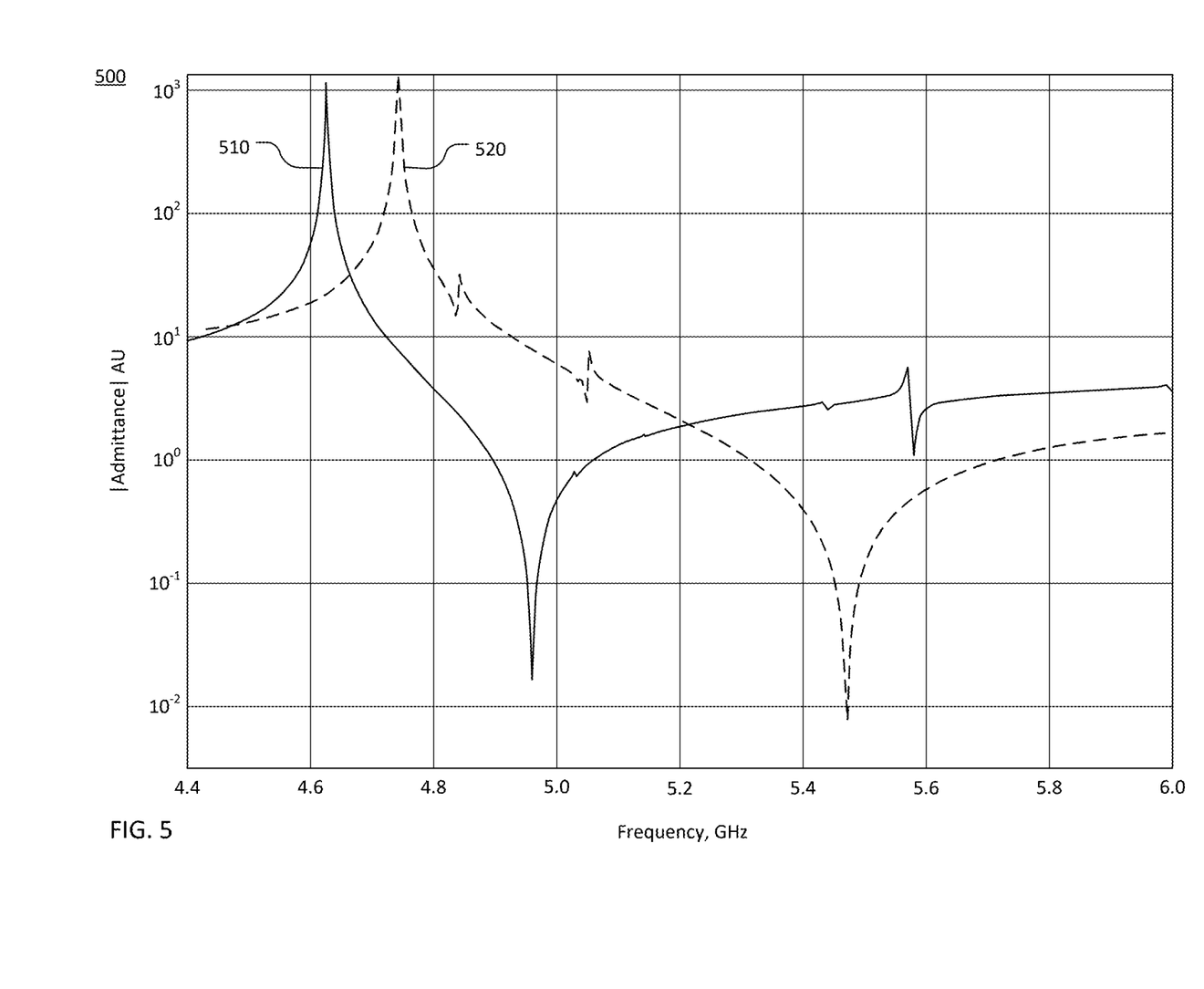
FIG. 5 is a chart comparing the admittances of an XBAR with partial Bragg reflectors and a conventional XBAR.

FIG. 5 is a chart 500 comparing the admittance of an XBAR with partial Bragg reflectors and a conventional XBAR. The solid line 510 is a plot of the magnitude of admittance as a function of frequency for an XBAR including partial Bragg reflectors. The piezoelectric plate is lithium niobate 400 nm thick. The IDT is aluminum 100 nm thick. The pitch and mark of the IDT fingers are 4.25 μm and 1.275 μm, respectively. The front-side and back-side partial Bragg reflectors each consist of a layer of $SiO_2$ 210 nm thick and a layer of SiN 350 nm thick. The resonance frequency is 4.63 GHz and the anti-resonance frequency is 4.96 GHz. The different between the anti-resonance and resonance frequencies is 330 MHz, or about 6.9% of the average of the resonance and anti-resonance frequencies.

The dashed line 520 is a plot of the magnitude of admittance as a function of frequency for a conventional XBAR (i.e. an XBAR without partial Bragg reflectors). The piezoelectric plate is lithium niobate 400 nm thick. The IDT is aluminum 100 nm thick. The pitch and mark of the IDT fingers are 3.7 μm and 0.47 μm, respectively. The resonance frequency is 4.71 GHz and the anti-resonance frequency is 5.32 GHz. The different between the anti-resonance and resonance frequencies is 610 MHz, or about 12.2% of the average of the resonance and anti-resonance frequencies.

The incorporation of partial Bragg reflectors in the XBAR devices 300, 400 results in a stiffer diaphragm with substantially higher thermal conductivity and potentially lower excitation of spurious modes compared to a conventional XBAR device. These benefits come at the cost of reducing electromechanical coupling and a correspondingly lower difference between the resonance and anti-resonance frequencies.

Figure 6:
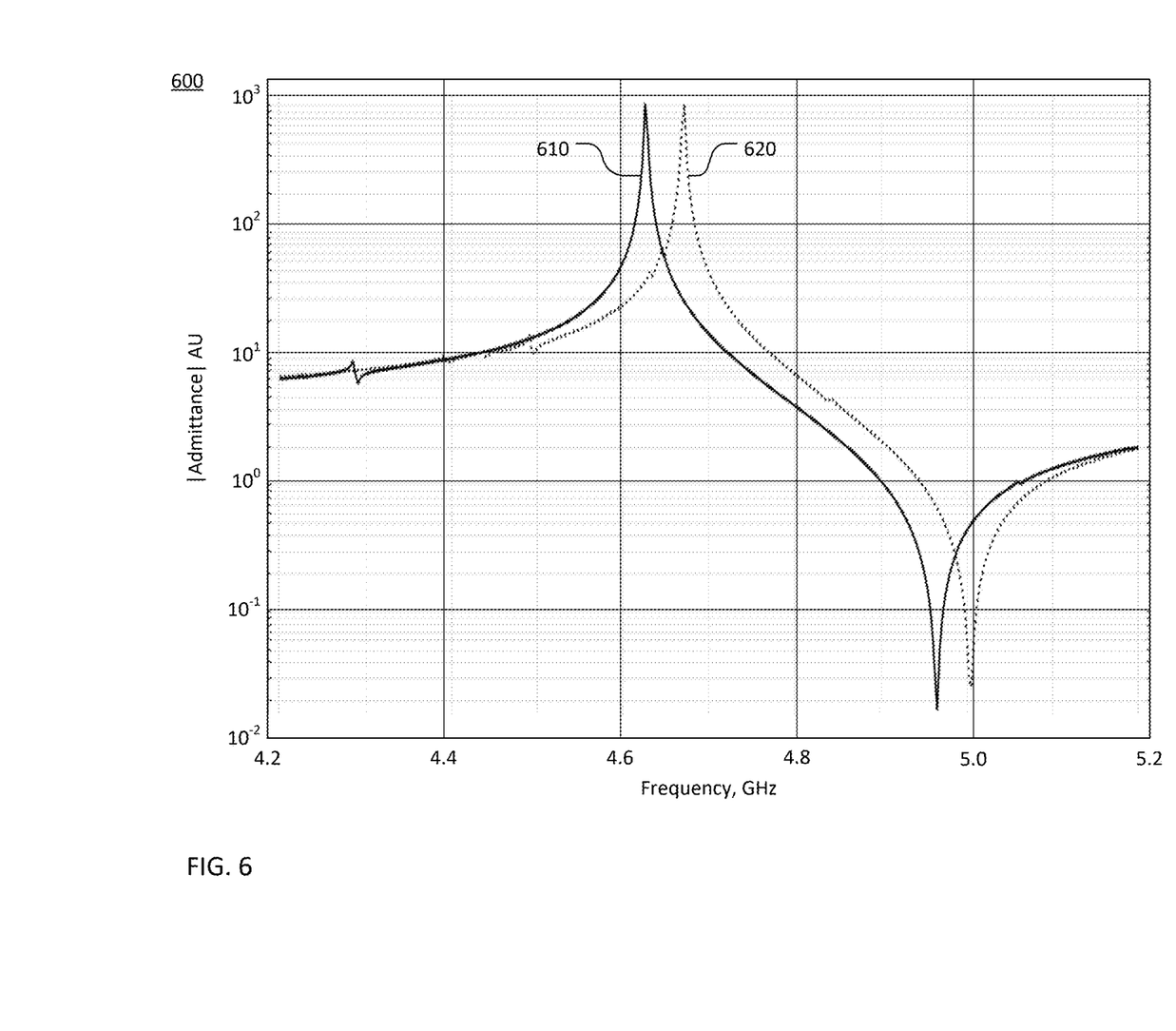
FIG. 6 is a chart comparing the admittances of two XBARs with partial Bragg reflectors and different pitch.

FIG. 6 is a chart 600 illustrating the use of pitch to tune the resonance and anti-resonance frequencies of an XBAR with partial Bragg reflectors. The solid line 610 is a plot of the magnitude of admittance as a function of frequency for an XBAR including partial Bragg reflectors. The piezoelectric plate is lithium niobate 400 nm thick. The IDT is aluminum 100 nm thick. The pitch and mark of the IDT fingers are 4.25 μm and 1.275 μm, respectively. The front-side and back-side partial Bragg reflectors each consist of a layer of $SiO_2$ 210 nm thick and a layer of SiN 350 nm thick. The resonance frequency is 4.63 GHz and the anti-resonance frequency is 4.96 GHz.

The dashed line 620 is a plot of the magnitude of admittance as a function of frequency for a similar XBAR with the same construction except the pitch and mark of the IDT fingers are 3.75 μm and 1.12 μm, respectively. The resonance frequency is 4.67 GHz and the anti-resonance frequency is 5.01 GHz. Changing the IDT pitch from 4.25 μm to 3.75 μm increases the resonance and anti-resonance frequencies by about 50 MHz. Varying the pitch over a range from 3 μm to 5 μm will provide a tuning range of about 200 MHz.

Description of Methods

Figure 7:
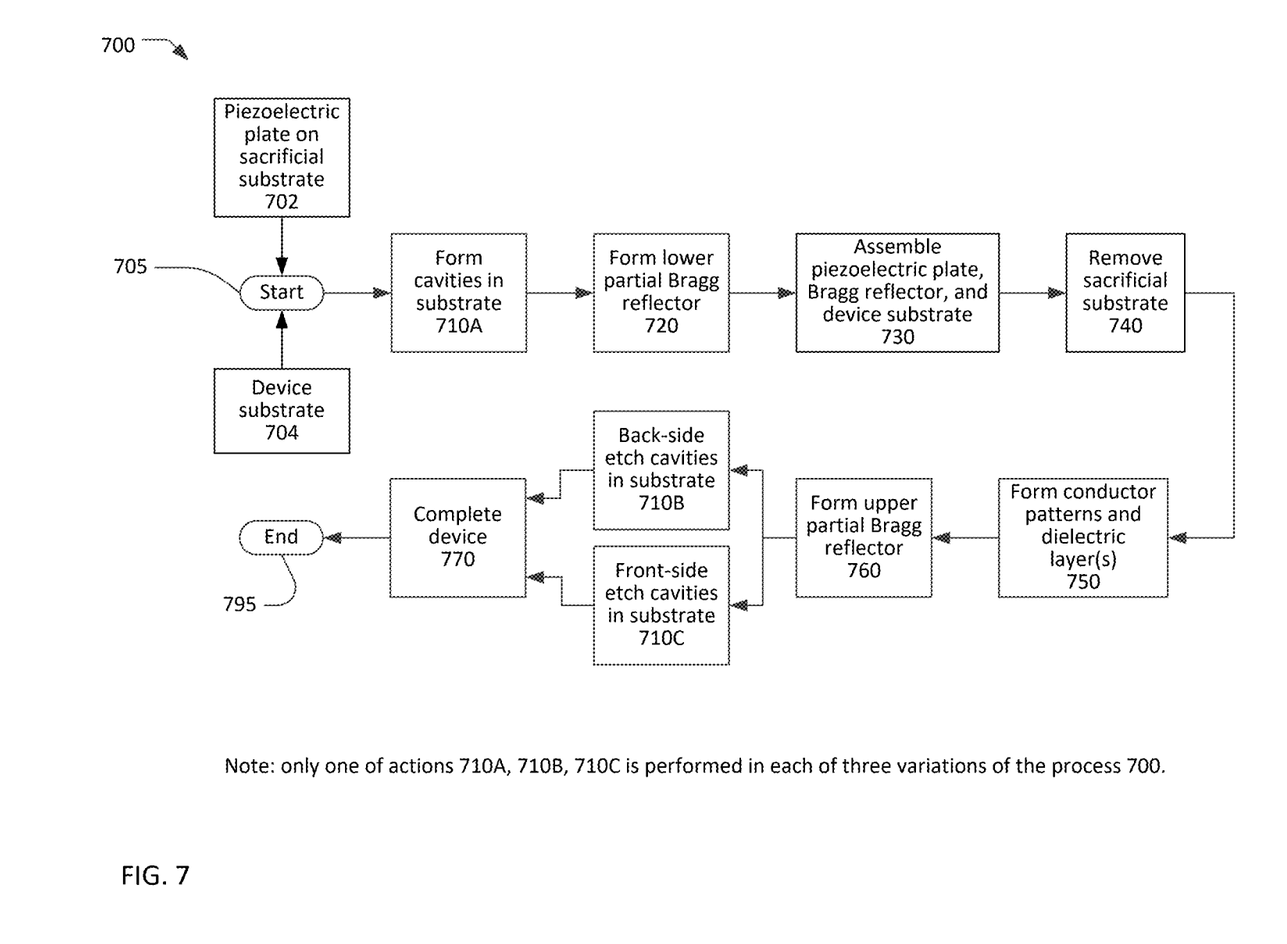
FIG. 7 is a flow chart of a process for fabricating an XBAR including partial Bragg reflectors.

FIG. 7 is a simplified flow chart showing a method 700 for making an XBAR including partial Bragg reflectors or a filter incorporating such XBARs. The method 700 starts at 705 with a thin piezoelectric plate disposed on a sacrificial substrate 702 and a device substrate 704. The method 700 ends at 795 with a completed XBAR or filter. The flow chart of FIG. 7 includes only major process steps. Various conventional process steps (e.g. surface preparation, cleaning, inspection, baking, annealing, monitoring, testing, etc.) may be performed before, between, after, and during the steps shown in FIG. 7.

The flow chart of FIG. 7 captures three variations of the method 700 for making an XBAR which differ in when and how cavities are formed in the substrate. The cavities may be formed at steps 710A, 710B, or 710C. Only one of these steps is performed in each of the three variations of the method 700.

Thin plates of single-crystal piezoelectric materials bonded to a non-piezoelectric substrate are commercially available. At the time of this application, both lithium niobate and lithium tantalate plates are available bonded to various substrates including silicon, quartz, and fused silica. Thin plates of other piezoelectric materials may be available now or in the future. The thickness of the piezoelectric plate may be between 300 nm and 1000 nm. The piezoelectric plate may be, for example, Z-cut, rotated Z-cut, or rotated Y-cut lithium niobate or lithium tantalate. The piezoelectric plate may be some other material and/or some other cut. The substrate may be silicon. When the substrate is silicon, a layer of SiO2 may be disposed between the piezoelectric plate and the substrate. The substrate may be some other material that allows formation of deep cavities by etching or other processing.

In one variation of the method 700, one or more cavities are formed in the substrate at 710A, before the piezoelectric plate is bonded to the substrate at 730. A separate cavity may be formed for each resonator in a filter device. The one or more cavities may be formed using conventional photolithographic and etching techniques. For example, the cavities may be formed using deep reactive ion etching (DRIE). Typically, the cavities formed at 710A will not penetrate through the substrate.

At 720 a lower partial acoustic Bragg reflector is formed by depositing layers of high acoustic impedance and low acoustic impedance dielectric materials onto the surface of the piezoelectric plate. Each layer has a thickness equal to or about one-fourth of the acoustic wavelength in the respective material at a predetermined frequency. The predetermined frequency may be, for example, the resonance frequency of the XBAR device, the antiresonance frequency of the XBAR device, or a frequency with the passband of a filter incorporating the XBAR device.

Materials having comparatively low acoustic impedance include silicon dioxide, silicon oxycarbide, and certain plastics such as cross-linked polyphenylene polymers. Materials having comparatively high acoustic impedance include silicon nitride and aluminum nitride. Both layers of the lower partial acoustic Bragg reflector may be deposited on either the surface of the piezoelectric plate on the sacrificial substrate 702 or a surface of the device substrate 704. Alternatively, the low acoustic impedance layer of the acoustic Bragg reflector may be deposited on the surface of the piezoelectric plate on the sacrificial substrate 702 and the high acoustic impedance layer of the acoustic Bragg reflector may be deposited on a surface of the device substrate 704.

At 730, the piezoelectric plate on the sacrificial substrate 702 and the device substrate 704 may be bonded such that the layers of the lower partial acoustic Bragg reflector are sandwiched between the piezoelectric plate and the device substrate. The piezoelectric plate on the sacrificial substrate 702 and the device substrate 704 may be bonded using a wafer bonding process such as direct bonding, surfaceactivated or plasma-activated bonding, electrostatic bonding, or some other bonding technique. Note that, when layers of the partial acoustic Bragg reflector are deposited on both the piezoelectric plate and the device substrate, the bonding will occur between the layers of the partial acoustic Bragg reflector. It is not necessary, although possible, to pattern the layers of the lower partial acoustic Bragg reflector. The layers of the lower partial acoustic Bragg reflector may extend between the piezoelectric plate and the substrate over all, or substantially all, of the area of the device.

After the piezoelectric plate on the sacrificial substrate 702 and the device substrate 704 are bonded, the sacrificial substrate, and any intervening layers, are removed at 740 to expose the surface of the piezoelectric plate (the surface that previously faced the sacrificial substrate). The sacrificial substrate may be removed, for example, by material-dependent wet or dry etching or some other process.

Conductor patterns and dielectric layers defining one or of XBAR devices are formed at 750. Typically, a filter device will have two or more conductor layers that are sequentially deposited and patterned. The conductor layers may include bonding pads, gold or solder bumps, or other means for making connection between the device and external circuitry. The conductor layers may be, for example, aluminum, an aluminum alloy, copper, a copper alloy, molybdenum, tungsten, beryllium, gold, or some other conductive metal. Optionally, one or more layers of other materials may be disposed below (i.e. between the conductor layer and the piezoelectric plate) and/or on top of the conductor layer. For example, a thin film of titanium, chrome, or other metal may be used to improve the adhesion between the conductor layers and the piezoelectric plate. The conductor layers may include bonding pads, gold or solder bumps, or other means for making connection between the device and external circuitry.

Conductor patterns may be formed at 750 by depositing the conductor layers over the surface of the piezoelectric plate and removing excess metal by etching through patterned photoresist. Alternatively, the conductor patterns may be formed at 750 using a lift-off process. Photoresist may be deposited over the piezoelectric plate and patterned to define the conductor pattern. The conductor layer may be deposited in sequence over the surface of the piezoelectric plate. The photoresist may then be removed, which removes the excess material, leaving the conductor pattern.

At 760, both layers of the upper partial acoustic Bragg reflector may be deposited on the surface of the piezoelectric plate between and, optionally, over the conductors of the conductor pattern formed at 750.

In a second variation of the process 700, one or more cavities are formed in the back side of the substrate at 710B after all of the conductor patterns and dielectric layers are formed at 750 and 760. A separate cavity may be formed for each resonator in a filter device. The one or more cavities may be formed using an anisotropic or orientation-dependent dry or wet etch to open holes through the back-side of the substrate to the piezoelectric plate.

In a third variation of the process 700, one or more cavities in the form of recesses in the substrate may be formed at 710C by etching the substrate using an etchant introduced through openings in the piezoelectric plate and partial Bragg reflectors. A separate cavity may be formed for each resonator in a filter device. The one or more cavities formed at 710C will not penetrate through the substrate.

When the one or more cavities are formed by etching the substrate at either 710B or 710C, it is preferable that the lower partial acoustic Bragg reflector act as an etch-stop to limit the extent of the etching process. To this end, the layer of the lower partial acoustic Bragg reflector adjacent to the substrate be resistant or impervious to the etchant used to form the cavities.

In all variations of the process 700, the filter device is completed at 770. Actions that may occur at 770 include depositing an encapsulation/passivation layer such as $SiO_2$ or $Si_3O_4$ over all or a portion of the device and/or forming bonding pads or solder bumps or other means for making connection between the device and external circuitry if these steps were not performed at 730. Other actions at 770 may include excising individual devices from a wafer containing multiple devices; other packaging steps; and testing. Another action that may occur at 770 is to tune the resonant frequencies of the resonators within the device by adding or removing metal or dielectric material from the front side of the device. After the filter device is completed, the process ends at 795.

A variation of the process 700 starts with a single-crystal piezoelectric wafer at 702 instead of a thin piezoelectric plate on a sacrificial substrate of a different material. Ions are implanted to a controlled depth beneath a surface of the piezoelectric wafer (not shown in FIG. 7). The portion of the wafer from the surface to the depth of the ion implantation is (or will become) the thin piezoelectric plate and the balance of the wafer is the sacrificial substrate. The partial acoustic Bragg reflector is formed at 720 as previously described and the piezoelectric wafer and device substrate are bonded at 730 such that the acoustic Bragg reflector is disposed between the ion-implanted surface of the piezoelectric wafer 702 and the device substrate 704. At 740, the piezoelectric wafer may be split at the plane of the implanted ions (for example, using thermal shock), leaving a thin plate of piezoelectric material exposed and bonded to the acoustic Bragg reflector. The thickness of the thin plate piezoelectric material is determined in part by the energy (and thus depth) of the implanted ions. The process of ion implantation and subsequent separation of a thin plate is commonly referred to as "ion slicing". After the piezoelectric wafer is split, the exposed surface of the piezoelectric plate may be planarized, and its thickness reduced, using, for example chemo-mechanical polishing.

CLOSING COMMENTS

Throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

It is claimed:

1. An acoustic resonator device comprising:
   a substrate having a surface;
   a single-crystal piezoelectric plate attached to the surface of the substrate except for a portion of the piezoelectric plate forming a diaphragm that spans a cavity over the substrate in a thickness direction of the substrate that is orthogonal to the surface of the substrate;
   an interdigital transducer (IDT) on a surface of the single-crystal piezoelectric plate such that interleaved fingers of the IDT are disposed on the diaphragm, the piezoelectric plate and the IDT configured such that a radio frequency signal applied to the IDT excites a primary shear acoustic mode in the diaphragm;
   a back-side partial Bragg reflector on a back surface of the diaphragm, the back-side partial Bragg reflector consisting of a layer of low acoustic impedance dielectric material on the back surface of the diaphragm and a layer of high acoustic impedance dielectric material on the layer of low acoustic impedance dielectric material and opposite the diaphragm; and
   a front-side partial Bragg reflector on a front surface of the diaphragm, with the front surface of the diaphragm opposing the back surface of the diaphragm, the front-side partial Bragg reflector consisting of a layer of low acoustic impedance dielectric material on the front surface of the diaphragm and a layer of high acoustic impedance dielectric material on the layer of low acoustic impedance dielectric material and opposite the diaphragm,
   wherein each of the back-side partial Bragg reflector and the front-side partial Bragg reflector is structurally configured such that the respective reflectors do not reflect at least a portion of energy of an incident acoustic wave when the primary shear acoustic mode is excited in the diaphragm, and
   wherein the primary shear acoustic mode is a bulk shear mode where acoustic energy propagates along a direction substantially orthogonal to the surface of the single-crystal piezoelectric plate and transverse to a direction of electric field created by the IDT.

2. The device of claim 1, wherein each layer of the front-side partial Bragg reflector and the back-side partial Bragg reflector has a thickness equal to one-quarter of a wavelength in the respective material of the primary shear acoustic mode at a predetermined frequency.

3. The device of claim 2, wherein the predetermined frequency is one of a resonance frequency of the device, an anti-resonance frequency of the device, and a frequency within a passband of a filter incorporating the device.

4. The device of claim 1, wherein the low acoustic impedance material is one of silicon dioxide and silicon oxycarbide.

5. The device of claim 1, wherein the high acoustic impedance material is one of silicon nitride and aluminum nitride.

6. The device of claim 1, wherein the single-crystal piezoelectric plate is one of lithium niobate and lithium tantalate.

7. The device of claim 1, wherein the back-side partial Bragg reflector extends between a surface of the piezoelectric plate and the surface of the substrate.

8. An acoustic resonator device comprising:
   a substrate;
   a piezoelectric layer attached to the substrate;
   an interdigital transducer (IDT) on a surface of the piezoelectric layer and including interleaved fingers, the IDT being configured such that a radio frequency signal applied to the IDT excites a primary shear acoustic mode in the piezoelectric layer;
   a back-side partial Bragg reflector on a back surface of the piezoelectric layer, the back-side partial Bragg reflector including of a layer of low acoustic impedance dielectric material on the back surface of the piezoelectric layer and a layer of high acoustic impedance dielectric material on the layer of low acoustic impedance dielectric material and opposite the piezoelectric layer; and
   a front-side partial Bragg reflector on a front surface of the piezoelectric layer, with the front surface of the piezoelectric layer opposing the back surface of the piezoelectric layer, the front-side partial Bragg reflector including of a layer of low acoustic impedance dielectric material on the front surface of the piezoelectric layer and a layer of high acoustic impedance dielectric material on the layer of low acoustic impedance dielectric material and opposite the piezoelectric layer,
   wherein each of the back-side partial Bragg reflector and the front-side partial Bragg reflector is configured such that the respective reflectors do not reflect at least a portion of energy of an incident acoustic wave when the primary shear acoustic mode is excited in the piezoelectric layer, and
   wherein the primary shear acoustic mode is a bulk shear mode where acoustic energy propagates along a direction substantially orthogonal to the surface of the piezoelectric layer and transverse to a direction of electric field created by the IDT.

9. The acoustic resonator device of claim 8, wherein each layer of the front-side partial Bragg reflector and the back-side partial Bragg reflector has a thickness equal to one-quarter of a wavelength in the respective material of the primary shear acoustic mode at a predetermined frequency.

10. The acoustic resonator device of claim 9, wherein the predetermined frequency is one of a resonance frequency of the device, an anti-resonance frequency of the device, and a frequency within a passband of a filter incorporating the device.

11. The acoustic resonator device of claim 8, wherein the low acoustic impedance material is one of silicon dioxide and silicon oxycarbide.

12. The acoustic resonator device of claim 8, wherein the high acoustic impedance material is one of silicon nitride and aluminum nitride.

13. The acoustic resonator device of claim 8, wherein the piezoelectric layer is one of lithium niobate and lithium tantalate.

14. The acoustic resonator device of claim 8, wherein the back-side partial Bragg reflector extends between a surface of the piezoelectric layer and a surface of the substrate.

* * * * *